United States Patent [19]

Colamonico et al.

[11] Patent Number: 5,323,425
[45] Date of Patent: Jun. 21, 1994

[54] DIRECT CONVERSION RECEIVER FOR DIGITAL SIGNALS AND METHOD FOR DEMODULATION OF SAID SIGNALS

[75] Inventors: Armando Colamonico; Manlio Saba, both of Milan, Italy

[73] Assignee: Italtel Societa Italiana, Milan, Italy

[21] Appl. No.: 777,308

[22] PCT Filed: Jan. 22, 1990

[86] PCT No.: PCT/EP90/00158
§ 371 Date: Jan. 31, 1992
§ 102(e) Date: Jan. 31, 1992

[87] PCT Pub. No.: WO90/16125
PCT Pub. Date: Dec. 27, 1990

[30] Foreign Application Priority Data

Jun. 15, 1989 [IT] Italy .................. 20891 A/89

[51] Int. Cl.[5] .............................. H04L 27/14
[52] U.S. Cl. .................... 375/98; 455/234.1; 329/350; 330/254

[58] Field of Search ............ 375/75, 98; 455/234.1, 455/245.1, 324, 315, 316, 314, 250.1, 239.1, 235.1, 243.1; 330/254, 129; 329/350

[56] References Cited

U.S. PATENT DOCUMENTS

| | | | |
|---|---|---|---|
| 2,525,151 | 10/1950 | Stenning | 455/234.1 |
| 4,736,390 | 4/1988 | Ward et al. | 455/315 |
| 4,817,167 | 3/1989 | Gassmann | 405/324 |
| 4,944,025 | 7/1990 | Gehring et al. | 455/264 |
| 4,955,078 | 9/1990 | Chung | 455/304 |
| 5,095,533 | 3/1992 | Loper et al. | 455/249.1 |

Primary Examiner—Stephen Chin
Assistant Examiner—T. Ghebretinsae

[57] ABSTRACT

In a digital mobile system, to avoid distortions and fadings due to multiple propagation and the doppler shift, adaptive gain of the amplifier of a demodulator must be controlled with information derived from the signal at a high frequency. This is accomplished without the use of intermediate frequency selection filters by first demodulating the signal to base band, filtering out the desired signal and remodulating the desired signal to a higher frequency. From this remodulated signal the adjustable gain is controlled.

11 Claims, 2 Drawing Sheets

DIRECT CONVERSION RECEIVER FOR DIGITAL SIGNALS AND METHOD FOR DEMODULATION OF SAID SIGNALS

A receiver of the direct conversion type for digital signals, quadrature modulated and with constant envelope is disclosed.

This receiver can be used in particular to receive radiofrequency signals according to a modulation of MSK or GMSK type, e.g. of the type employed in a digital radiomobile system. The receiver shall be described hereafter giving particular attention to a receiver for digital radiomobile system, this application being meant however as preferred and not restrictive.

A method for demodulation of radiofrequency modulated digital signals with a system of quadrature modulation and constant envelope is also disclosed.

BACKGROUND OF THE INVENTION

In particular, in a digital mobile system, one user signal is digitally coded and data relevant to a given number of users, e.g. eight users, are multiplexed according to time division, to form a frame where a time slot containing a burst is assigned to each user.

The so-formed signal modulates the phase of a carrier wave, e.g. with constant width envelope phase modulation or GMSK (Gaussian Minimum Shift Keying) and each mobile receiver extracts from this flow only the data of which it is concerned.

By the term demodulation it is meant the baseband conversion of a radiofrequency signal multiplexed with other similar signals (channels).

The signal received by a mobile equipment shows distortions and fadings essentially due to the multiple propagation and to the Doppler shift. This phenomenon (fading) can be broken down in a slow variation of the local mean (slow fading) with statistic distribution of log-normal type, and in a faster variation (fast fading) with Raylaigh statistic distribution.

For these applications, demodulating circuits are known, with one or more conversions at intermediate frequencies according to the superhetherodyne principle, which allows the selection of the single multiplexed channels using fixed filters and different conversion oscillators. These circuits require the utilization of intermediate frequency selection filters (FI) to separate the different channels, which are manufactured according to technologies which cannot be integrated in semiconductor circuits, for instance quartz filters or surface acoustic wave (SAW). The integration of the whole demodulation circuit is not therefore possible, that is its implementation on a single integrated circuit. In a mobile system for instance, where each user set includes a demodulator, an integrated manufacturing reducing the cost of the set and improving its reliability is higly desiderable.

A receiver of this type is disclosed in the Journal of the Institution of Electronic and Radio Engineers (1988) May, No. 3, London, Gr. Britain "A UNIDIRECTIONAL SATELLITE PAGING SYSTEM FOR LAND MOBILE USERS" - I. E. Casewell, I. C. Ferebee and Professor M. Tomlinson where the gain control signal is directly derived from the demodulated baseband signal. As a consequence the low frequency of the demodulated signal cause the use of a detector for deriving the gain control signal with higher time constant in comparison with the time constant suitable for baseband frequencies.

This results to a slower gain adaption at rapid variations of reception conditions.

Methods are known for direct conversion demodulation of these modulated signals (PSK) and frequency (FSK), however the relevant circuits for implementing the methods are inadequate for demodulation of signals with MSK and GMSK modulations which are employed in digital mobile systems, since the same involve an unacceptable signal degradation.

A purpose of the present invention is to overcome the above mentioned troubles of the previous technique, and more in particular to realize a receiver which could be easily integrated and be capable to compensate fading effects. The receiver can be part of a mobile set, or part of a base station.

SUMMARY OF THE INVENTION

This purpose is attained by the invention itself one embodiment comprising a direct receiver for numeric or digital signals constant envelope quadrature modulated, wherein the demodulating circuit includes:

a radiofrequency amplifier with gain automatic control;

a local oscillator having frequency equal to the carrier one;

two multiplier units having an input connected to the output of said amplifier and the other two inputs connected to the output of the local oscillator, in a direct manner and through a 90° phase shifter, respectively;

a lowpass filter connected to the output of each one of said multiplier units;

two additional multiplier units having an input connected to each one of said lowpass filters and the other inputs connected to a remodulation local oscillator, directly and through a 90°, respectively;

one adder connected to the outputs of said additional multiplier units;

one detector connected to the output of said adder;

an additional lowpass filter having the input connected to the detector output and the output connected to said amplifier with gain automatic control.

According to our invention the gain control signal is not directly derived from the demodulated baseband signal. The demodulation baseband signal is first remodulated and then applied to a detector for deriving the gain control signal. Due to the high frequency of the remodulated signal, a detector with a smaller time constant in comparison with the time constant suitable for baseband frequencies can be used. This results to a faster gain adaption at rapid variations of receptions conditions and is particularly important for mobile receivers.

A further embodiment of the invention comprises a direct conversion receiver for constant envelope quadrature modulated digital signals, wherein the demodulating circuit includes:

a local oscillator having frequency equal to the carrier one;

two multiplier units having an input receiving the signal coming from the antenna and other two inputs connected to the output of the local oscillator, in a direct manner and through a 90° phase shifter, respectively;

a lowpass filter connected to the output of each one of said multiplier units;

two baseband amplifiers with gain automatic control, each one connected to the output of one of said filters;

two additional multiplier units having an input connected to each one of said lowpass filters and the other input connected to a remodulation local oscillator, directly and through a 90° phase shifter, respectively;

one adder connected to the outputs of said additional multiplier units;

one detector connected to the output of said adder;

an additional lowpass filter having the input connected to the detector output and the output connected to said amplifier with gain automatic control.

Another embodiment of the invention comprises a method for demodulation of a digital signal including a plurality of multiplexed channels, modulated according to a constant envelope quadrature modulation system, wherein:

the baseband conversion through the beat of the signal received with a locally generated signal having a first frequency equal to the carrier one;

a lowpass filtering to extract the whished signal of baseband channel;

a remodulation of the baseband channel signal with a second frequency locally generated;

the extraction of a control signal from said remodulated signal; and at least one variable gain amplification of the radiofrequency signal and/or of the baseband signal, controlled by said control signal.

BRIEF DESCRIPTION OF THE DRAWINGS

The invention shall be illustrated and explained now more in detail, making reference to the preferred, but not restrictive, forms of realization, with the support of the enclosed drawings where.

DETAILED DESCRIPTION

Figure 1:
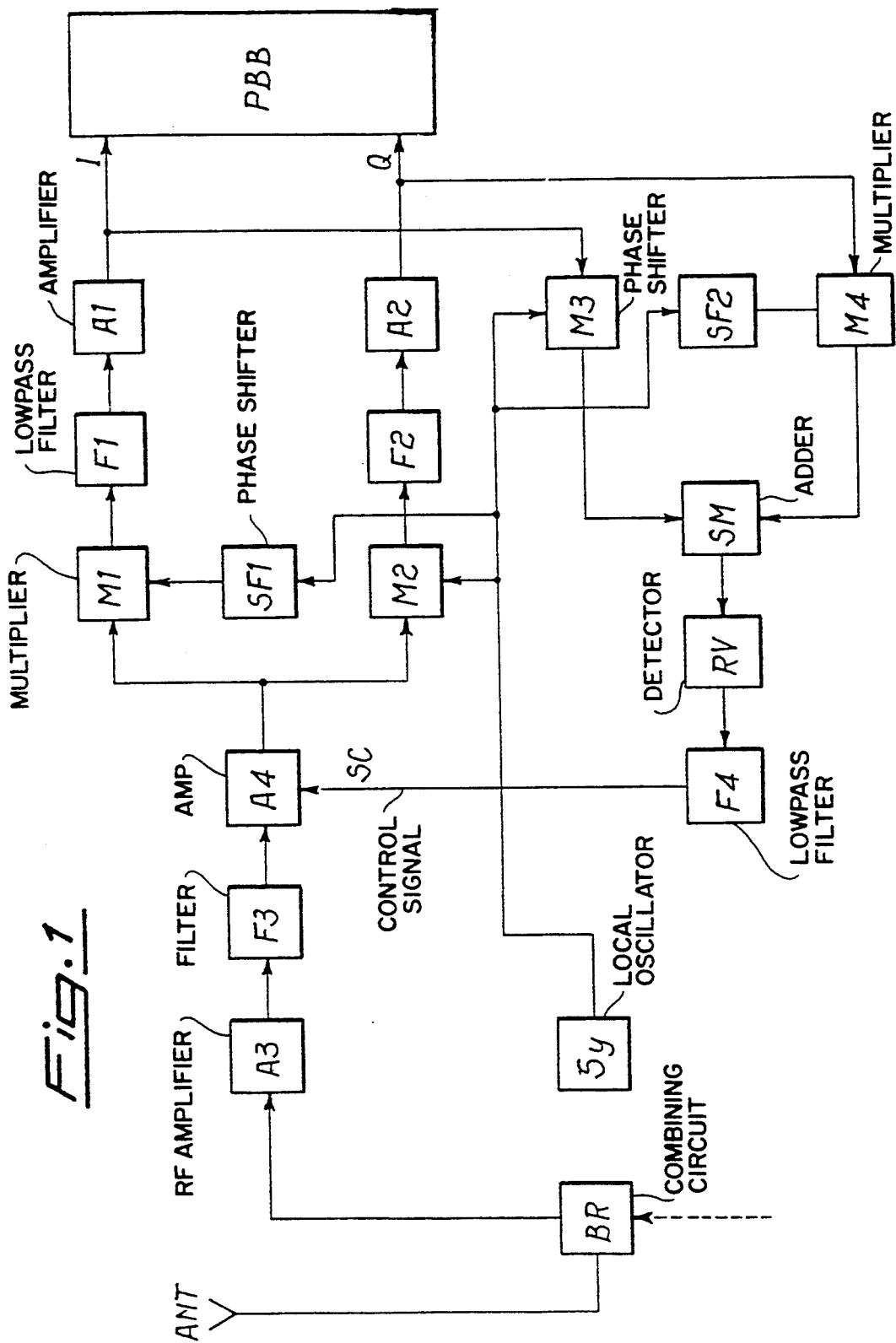
FIG. 1 shows a block diagram of the receiver according to the invention.

With reference to FIG. 1, the receiver according to the invention includes a common antenna ANT receiving a radiofrequency signal, typically in the 900 MHz band of a digital mobile system, and a combining circuit BR to distribute the signal received to different receivers in the same base station or a simple antenna switch in the mobile station. The receiver includes also a radiofrequency amplifier A3 and a filter F3 of the bandpass type, limiting the spectrum to that of channels dedicated to the service, for instance from 935 to 960 MHz.

The signal, so filtered, is thus carried to the output of an amplifier A4 at variable gain (CAG), where the gain is controlled through a control signal SC which shall be described more in detail hereafter.

The signal outcoming from amplifier A4, which is at constant envelope and has a known signal level, is directly converted in baseband through beat with a frequency equal or anyway very close (generally a fraction of the useful band) to the frequency of the selected carried and, preferably, locally generated. The output of the amplifier A4 is carried to the input of two multiplier units M1 and M2 which receive on other inputs, two signals at the carrier frequency and shifted by 90° by means of a phase shifter SF1. The carrier can be locally generated for instance, by a synthesizer Sy.

At the outputs of multipliers M1 and M2 the two components of the baseband signal are available, and these are filtered to eliminate adjacent channels and to limit noise by means of lowpass filter F1 and F2 respectively. The outputs of filters constitute the components I (in phase) and Q (in quadrature) of the useful signal and are amplified (A1, A2) further and processed in the known manner to reconstruct the desired data signal. To simplify the picture, FIG. 1 shows only the baseband processor PBB. It must be noted that, compared to the conventional technique, the channel filtering is cheaply obtained through lowpass filters which can be easily integrated, instead of bandpass filters. In other words, baseband converters and lowpass filters constitute the equivalent of the intermediate frequency filter in superheterodyne receivers.

I and Q signals in baseband so obtained result being filtered both by the interference of adjacent channels and by the broadband noise.

To obtain an effective automatic gain control, a control signal SC is necessary depending only on the envelope of the filtered signal, without the effects deriving from channels adjacent to the concerned one.

According to the invention, this control signal is obtained by re-modulating the baseband signal (that is the two components I and Q), thus obtaining a radiofrequency signal which is however purified from interference and noise. This signal is sensed and a continuous control signal SC is obtained which controls the CAG of amplifier A4.

This obtained as follows. Signals I and Q outcoming from amplifiers A1 and A2 are brought to the input of two multipliers M3 and M4 respectively, which receive on the other inputs two components in quadrature of a frequency f, thanks to a phase shifter SF2. Frequency f locally generated for re-modulation can be the same frequency generated by Sy and used for the baseband demodulation, as shown in FIG. 1, or it can be different as it is shown hereafter with reference to FIG. 2.

Multiplier outputs are added in the adder circuit SM, and the remodulated signal so obtained is sensed in a circuit RV and filtered with filter F4, obtaining a continuous signal SC capable to control the CAG of amplifier A4.

Suitably selecting the frequency f to carry out the remodulation, an envelope is obtained on which a demodulation with adequately small time constant can be operated. This should not be possible if the power of the two baseband components which can vary at slow pace, is sensed. To follow the modifications of the quick fading, the envelope detector must infact be sufficiently fast.

In other words, the frequency at which the remodulation is made can vary within wide limits, provided it is a frequency high enough to enable a time constant quick enough to follow the quick fading. More in particular it must result:

$f = 10/T$ where T is the intervention time required by CAG.

The remodulation frequency can also be the same of the conversion local oscillator if no insulation technical problem exist which could cause oscillations.

Figure 2:
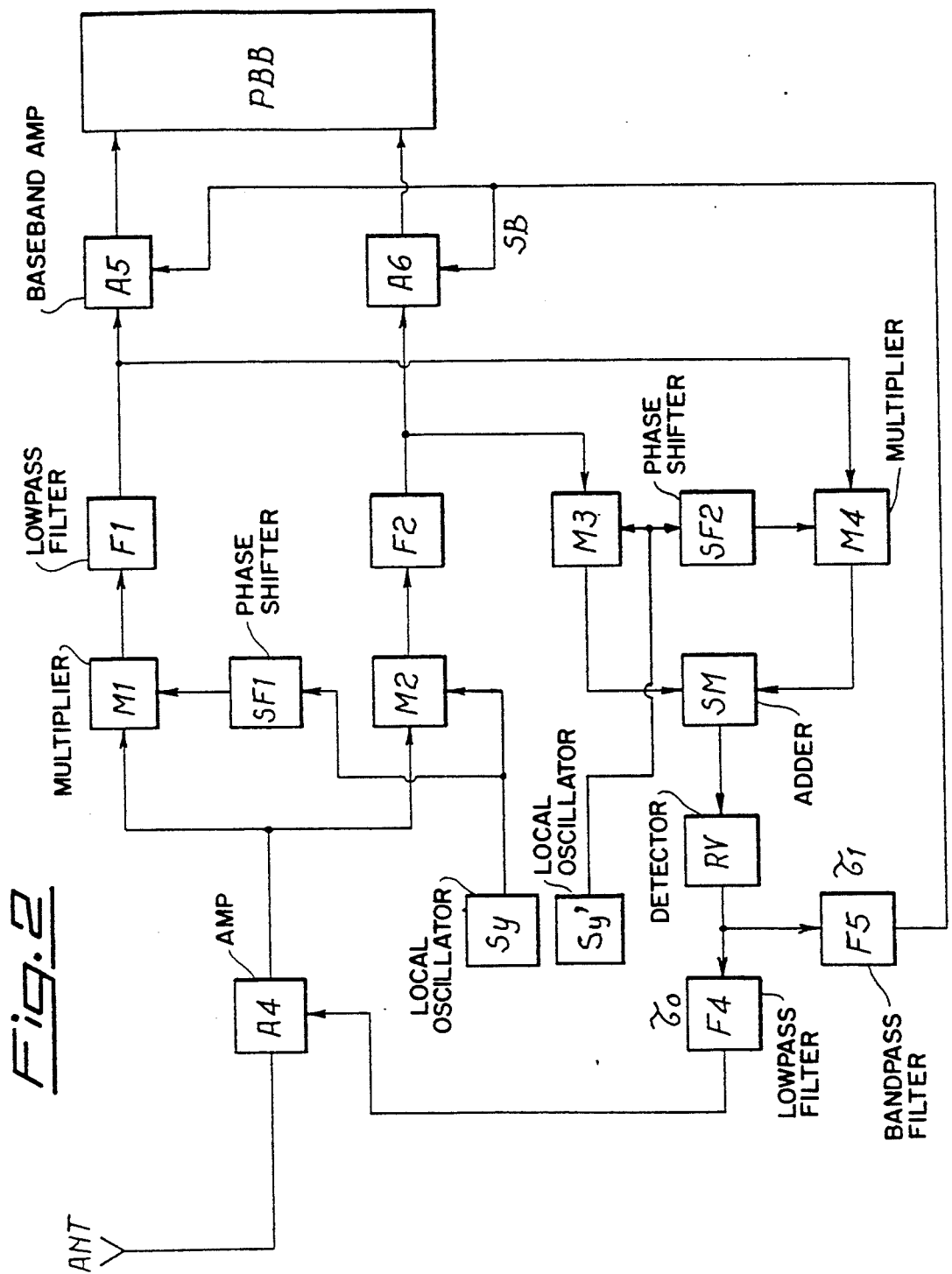
FIG. 2 shows a second realization of the receiver according to the invention.

A further form of realization of the invention is shown in FIG. 2, where the same references for equal or similar blocks have been employed and for sake of clearness some blocks are not shown.

The circuit of FIG. 2 foresees a radiofrequency amplifier A4 with CAG controlled by the signal obtained from remodulation, similarily to the version of FIG. 1, and it foresees also two baseband amplifiers A5 and A6 of the gain control type, receiving a common control signal SB always obtained from detector RV, but through a Filters 5. The time constant of this filter is different from the one of F4. The effects of the quick fading can be thus compensated with the feedforward configuration shown.

More in general, according to the invention, the gain automatic control can be distributed in several points of the receiver, both at radiofrequency and baseband, all controlled by the same signal obtained from remodulation and with an adequate time constant.

Always in FIG. 2 it can be noted that it is foreseen a synthesizer, suitable to generate a remodulation frequency different from the one generated by the synthesizer Sy and used for demodulation operations.

From the above it is evident that the receiver according to the invention enables a manufacturing in the integrated form, thanks to the elimination of conventional bandpass filters FI, and enables also the compensation of fading effects on the signal, improving the quality of the same.

We claim:

1. In a receiver for digital signals transmitted at a carrier frequency, a demodulating circuit comprising:
   a radiofrequency amplifier with automatic gain control;
   a local oscillator emitting a signal having a frequency equal to the carrier frequency;
   first and second multiplier units, each unit having a first input connected to an output of said amplifier, said first multiplier unit having a second input connected to an output of the local oscillator in a direct manner and said second multiplier unit having a second input connected to an output of the local oscillator through a 90° phase shifter;
   first and second lowpass filters, each connected to an output of one of said first and second multiplier units;
   third and fourth multiplier units, each unit having a first input connected to one of said first and second lowpass filters, said third multiplier unit having a second input connected to a remodulation local oscillator, said fourth multiplier unit having a second input connected to a remodulation local oscillator through a 90° phase shifter;
   an adder connected to outputs of said third and fourth multiplier units;
   a detector connected to an output of said adder;
   a third lowpass filter having an input connected to an output of the detector and an output thereof connected to a control input of said radiofrequency amplifier with automatic gain control.

2. In a direct conversion receiver for constant envelope quadrature modulated digital signals, a demodulating circuit comprising:
   a first amplifier with automatic gain control, for amplifying a radiofrequency signal;
   a local oscillator emitting a signal having frequency equal to a carrier frequency;
   first and second multiplier units, each unit receiving at an input the signal coming from said first amplifier, each unit having another input connected to an output of the local oscillator, the input of said first multiplier unit being connected in a direct manner and the input of said second multiplier unit being connected through a 90° phase shifter;
   first and second lowpass filters, each connected to an output of one of said first and second multiplier units;
   two baseband amplifiers with automatic gain control, each connected to an output of one of said first and second lowpass filters;
   third and fourth multiplier units, each having an input connected to one of said first and second lowpass filters each having an input connected to a remodulation local oscillator, the input of said third multiplier unit being connected directly and the input of said fourth multiplier unit being connected through a 90° phase shifters;
   an adder connected to outputs of said third and fourth multiplier units.

3. The demodulating circuit according to claims 1 or 2, wherein said local oscillator and remodulation local oscillator are the same oscillator.

4. The demodulating circuit according to claim 2 wherein the output of said bandpass filter is connected to said baseband amplifiers to control a gain amplification thereof.

5. A method for demodulation of a digital signal transmitted at a carrier frequency including a plurality of multiplexed channels, the method comprising the steps of:
   (a) converging to baseband a signal received with a locally generated signal having a first frequency equal to the carrier frequency;
   (b) extracting a desired signal of the baseband channel with lowpass filtering;
   (c) remodulating the baseband channel signal with a second frequency locally generated, thereby creating a remodulated signal;
   (d) generating a first signal from the remodulated signal;
   (e) filtering the first signal to produce a second signal; and
   (f) automatically varying gain amplification of a radio frequency signal in accordance with the second signal.

6. The method according to claim 5, wherein the first and second frequencies are equal.

7. The method according to claim 5, wherein the second frequency locally generated is equal to 10/T wherein T is a desired intervention time for the automatic gain control.

8. The method according to claim 5 further comprising the step of:
   (g) filtering the first signal to produce a third signal; and
   (h) automatically varying a gain amplification of the baseband signal in accordance with the third signal.

9. The method of claim 8 wherein step (e) includes filtering the first signal with a lowpass filter; and step (g) includes filtering the first signal with a bandpass filter.

10. The method of claim 5 wherein step (e) includes filtering the first signal with a lowpass filter.

11. The method of claim 9 wherein step (h) includes automatically varying the gain amplification of the baseband signal with a feed forward loop.

* * * * *